(12) United States Patent
Haba et al.

(10) Patent No.: US 7,709,297 B2
(45) Date of Patent: May 4, 2010

(54) MICROELECTRONIC PACKAGE WITH THERMAL ACCESS

(75) Inventors: Belgacem Haba, Saratoga, CA (US); Stuart E. Wilson, Menlo Park, CA (US)

(73) Assignee: Tessera, Inc., San Jose, CA (US)

( * ) Notice: Subject to any disclaimer, the term of this patent is extended or adjusted under 35 U.S.C. 154(b) by 464 days.

(21) Appl. No.: 11/648,719

(22) Filed: Dec. 29, 2006

(65) Prior Publication Data

US 2008/0160675 A1   Jul. 3, 2008

(51) Int. Cl.
*H01L 21/00*   (2006.01)
(52) U.S. Cl. .................. 438/122; 438/121; 438/125; 257/E21.511
(58) Field of Classification Search ............ 438/121, 438/122, 125
See application file for complete search history.

(56) References Cited

U.S. PATENT DOCUMENTS

| | | | |
|---|---|---|---|
| 6,011,310 A * | 1/2000 | Naito et al. ................ 257/774 |
| 6,255,740 B1 * | 7/2001 | Tsuji et al. ................. 257/792 |
| 6,258,625 B1 * | 7/2001 | Brofman et al. ............. 438/107 |
| 6,716,675 B2 * | 4/2004 | Waki et al. ................. 438/122 |
| 6,762,118 B2 * | 7/2004 | Liu et al. ................... 438/613 |
| 6,902,869 B2 * | 6/2005 | Appelt et al. ............... 430/311 |
| 2005/0181655 A1 * | 8/2005 | Haba et al. ................. 439/331 |

* cited by examiner

*Primary Examiner*—David A Zarneke
(74) *Attorney, Agent, or Firm*—Lerner, David, Littenberg, Krumholz & Mentlik, LLP

(57) ABSTRACT

A method of forming a microelectronic package including the steps of providing a three-layer metal plate, having a first layer, a second layer and a third layer. A plurality of conductive elements is formed from the first layer of the metal plate. A dielectric sheet is attached to the first layer of the metal plate, such that the dielectric sheet is remote from the third layer. A plurality of conductive features is then formed from the third layer of the metal plate which are also remote from the dielectric sheet. A microelectronic element is next electrically conducted to the conductive elements and a heat spreader is thermally connected the microelectronic element.

11 Claims, 10 Drawing Sheets

MICROELECTRONIC PACKAGE WITH THERMAL ACCESS

BACKGROUND OF THE INVENTION

The present invention relates to methods for making microelectronic components for microelectronic packages and assemblies.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Certain types of packages have been developed which utilize a microelectronic component having a flexible dielectric substrate having conductive traces disposed thereon. In such an arrangement, electrically conductive posts or pillars project from a surface of the flexible substrate. Each post is connected to a portion of one of the traces. This type of microelectronic component is particularly useful in chip packages having arrangements that allow each post to move independently of the other posts. The movement of the posts allows the tips of the plural post to simultaneously engage contact pads on a circuit board despite irregularities in the circuit board or the package, such as warpage of the circuit board. Additionally, this facilitates testing of the package using simple test boards which may have substantially planar contacts, and avoids the need for specialized, expensive test sockets.

This type of microelectronic component has various applications and can be used in a number of different microelectronic package arrangements. As disclosed in certain preferred embodiments of U.S. patent application Ser. Nos. 11/014,439; 10/985,119; and 10/985,126, the disclosures of which are incorporated by reference herein, one such microelectronic package can include a microelectronic element such as a semiconductor chip and a microelectronic component comprising a flexible substrate spaced from and overlying a first face of the microelectronic element. Such a component can include a plurality of conductive posts extending from the flexible substrate and projecting away from the microelectronic element, at least some of the conductive posts being electrically interconnected with the microelectronic element. Additionally, such a package can include a plurality of support elements disposed between the microelectronic element and the substrate and supporting the flexible substrate over the microelectronic element. Desirably, at least some of the conductive posts are offset in horizontal directions parallel to the plane of the flexible substrate from the support elements. For example, the support elements may be disposed in an array with zones of the flexible substrate disposed between adjacent support elements, and the posts may be disposed near the centers of such zones.

The offset between the posts and the support elements allows the posts, and particularly the bases of the posts adjacent the substrate, to move relative to the microelectronic element. This arrangement can allow each post to move independently of the other posts.

The flexible substrate can overlie the front or contact-bearing face of the microelectronic element. In this arrangement at least some of the support elements desirably are electrically conductive elements such as solder balls. The conductive support elements may electrically interconnect at least some of the contacts of the microelectronic element with at least some of the conductive posts. In preferred forms, this arrangement can prove low-impedance conductive paths between the posts and the microelectronic element, suitable for high-frequency signal transmission. At least some of the posts can be connected to at least some of the contacts on the microelectronic element by conductive support elements immediately adjacent to those posts. It is advantageous that conductive traces provided on the flexible substrate electrically interconnect at least some of the conductive posts with at least some of the conductive support elements. These traces may be very short; the length of each trace desirably being equal to the offset distance between a single post and a single support element.

The flexible dielectric substrate utilized in such a microelectronic component can be made from a material such as a polyimide or other polymeric sheet. It includes a top surface and a bottom surface remote therefrom. Although the thickness of the dielectric substrate will vary with the application, the dielectric substrate most typically is about 10 µm-100 µm thick. The flexible sheet has conductive traces thereon. In one embodiment the conductive traces are disposed on the bottom surface of the flexible sheet. However, in other embodiments, the conductive traces may extend on the top surface of the flexible sheet; on both the top and bottom faces or within the interior of flexible substrate. Conductive traces may be formed from any electrically conductive material, but most typically are formed from copper, copper alloys, gold or combinations of these materials. The thickness of the traces will also vary with the application, but typically is about 5 µm-25 µm. Traces are arranged so that each trace has a support end and a post end remote from the support end. The dielectric sheet, traces and posts can be fabricated by a process such as that disclosed in co-pending, commonly assigned U.S. patent application Ser. No. 10/959,465, the disclosure of which is incorporated by reference herein. As disclosed in greater detail in the '465 application, a metallic plate is etched or otherwise treated to form numerous metallic posts projecting from the plate. A dielectric layer is applied to this plate so that the posts project through the dielectric layer. An inner side of the dielectric layer faces toward the metallic plate, whereas the outer side of the dielectric layer faces towards the tips of the posts. Previously this dielectric layer has been fabricated by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

Despite these advances in the art, still further improvements in making microelectronic components would be desirable.

SUMMARY OF THE INVENTION

The present invention is directed towards a method of forming a microelectronic package and assembly as well as an apparatus including a microelectronic package and microelectronic assembly. According to one aspect of the present invention, the method of forming a microelectronic package includes providing a three-layer metal plate having a first layer, a second layer and a third layer. A plurality of conductive elements is formed from the first layer of the metal plate. A dielectric sheet is then attached to the first layer of the metal plate, and is remote from the third layer of the metal plate.

Subsequently, a plurality of conductive features is formed from the third layer of the metal plate, which is also remote from the dielectric sheet. A microelectronic element, such as a chip is then electrically connected to the conductive elements and a heat spreader is thermally connected to the microelectronic element.

The step of forming the plurality of conductive elements may include forming traces that are electrically connected to the microelectronic element and the conductive features of the third layer. In addition, a ground plate may be formed along with the traces. Preferably the traces are electrically isolated from the ground plate. The conductive elements may also include bond pads and contact pads, wherein the bond pads are disposed at a first end of the traces and the contact pads are disposed at a second end of the traces. While the traces, bond pads and contact pads are in electrical communication with one another, all three elements are preferably electrically isolated from the ground plate.

The conductive features formed using the third layer of the three-layer metal plate may include posts. Preferably, at least some of the posts are in electrical communication with at least some of the contact pads of the first layer. In addition, at least one of the posts may be in communication with the ground plate.

In one aspect of the present invention, a microelectronic assembly may be created by providing a circuit panel having contacts and a thermal pad. The microelectronic package discussed above, may be attached electrically and thermally to the circuit panel wherein at least some of the conductive features of the third layer of the metal plate are in electrical communication with the contacts of the circuit panel and the heat spreader is thermally connected to the thermal pad of the circuit panel. The heat spreader may be a separate element applied to the microelectronic package or the heat spreader may be formed in conjunction with the post from the third layer of the metal plate. In one embodiment, the heat spreader is comprised of a solder.

In another aspect of the present invention, a microelectronic package may include a first dielectric element having a first surface and an oppositely-facing second surface. The package may also include a plurality of traces having a first side and a second side, wherein the second surface of the dielectric element confronts the first side of the plurality of the traces. The package may include a plurality of conductive posts remote from the dielectric element and adjacent the second side of the plurality of traces. A microelectronic element, such as a bare chip, may be placed in communication with at least some of the plurality of traces. Additionally, the microelectronic package may include a heat spreader thermally connected to the microelectronic element.

DETAILED DESCRIPTION

Figure 1:
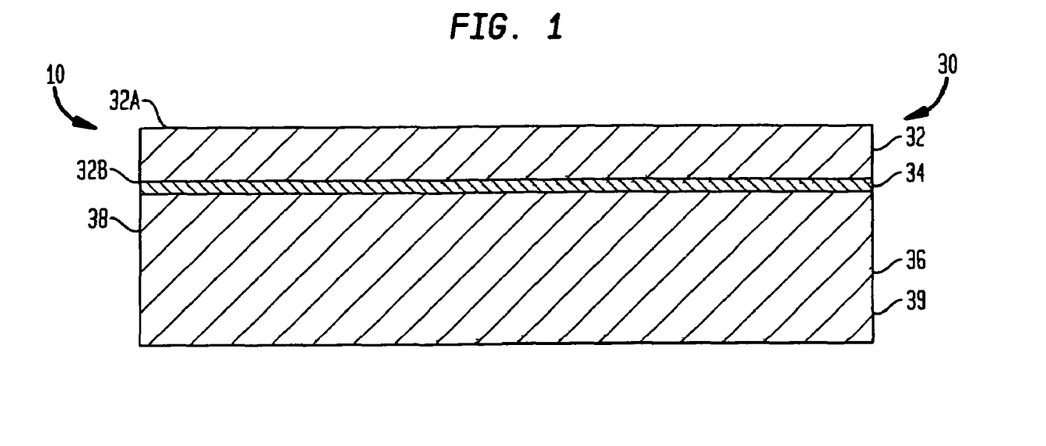
FIG. 1 is a cross-sectional view of one embodiment of the present invention during an manufacturing process.

A method according to one embodiment of the present invention, the microelectronic package 10 includes a metallic plate 30, as shown in FIG. 1. The metallic plate 30 includes a top layer 32 made of a conductive material, an intermediate etch-stop layer 34 and a bottom layer 36 made of a conductive material. The top and bottom layers 32, 36 may include electrically conductive materials such as copper. The intermediate etch-stop layer may include materials such as nickel. The metallic plate 30 also includes a first edge 38 and a second edge 39.

Figure 2:
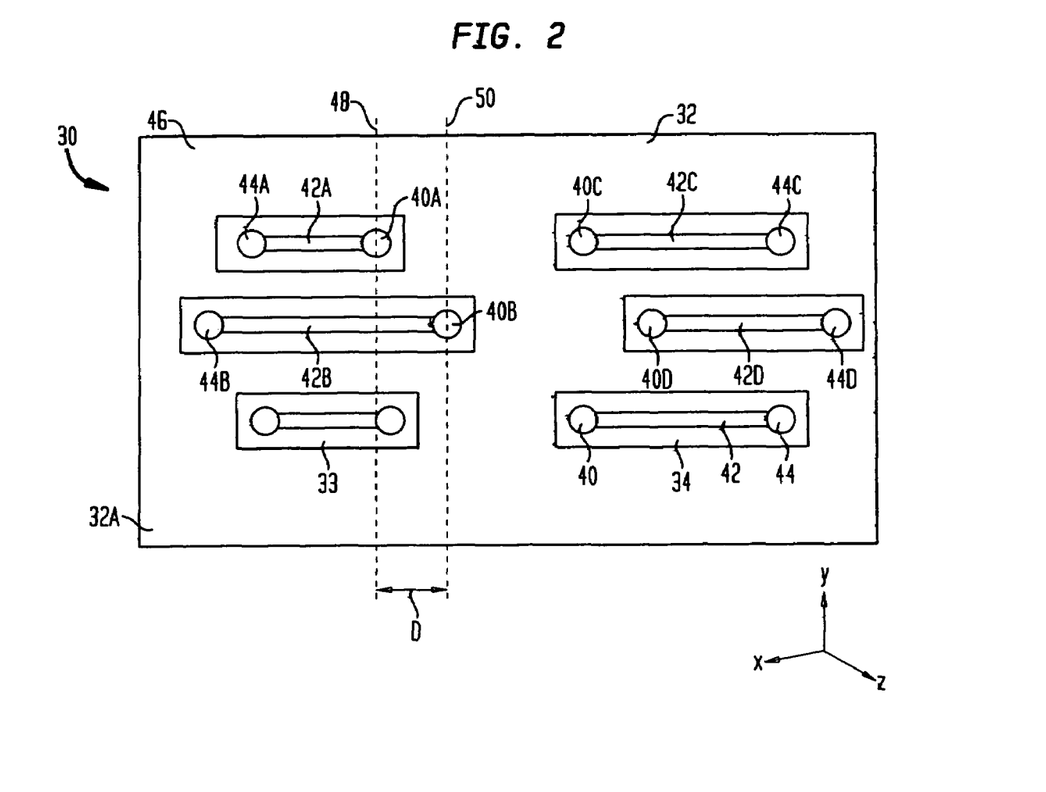
FIG. 2 is a top view of the embodiment of FIG. 1 at a later stage of the process.

Referring to FIG. 2, the top layer 32 of the metallic plate 30 is stamped or etched to remove portions of the layer. Preferably any etching or stamping process is manipulated such that portions of the top layer 32 may be removed without affecting portions of the intermediate etch-stop layer 34. Since the top layer 32 is preferably comprised of a different material than the intermediate etch-stop layer 34 this can be easily done for instance by utilizing an etching process that removes portions of the copper of the top layer, but does not affect the nickel of the intermediate etch-stop layer. During the etching or stamping process, portions of the top layer 32 are removed to form openings or grooves 33 extending from a first face 32A of the top layer 32 to a second face 32B of the top layer, as shown in FIGS. 1 and 2. Once formed, the grooves 33 enable a portion of the intermediate etch-stop layer 34 to be viewed from above the metal layer 30, as shown in FIG. 2. In one aspect, the top layer 32 is etched or stamped to form a plurality of bond pads 40, traces 42 and contact pads 44. A bond pad 40 is preferably in electrical contact with a contact pad 44 via a trace 42. And a hole or groove 33 extends completely around the conductive elements-bond pads, traces and contact pads—such that the conductive elements are isolated from the rest of the top layer 32. Once isolated, the conductive elements are electrically separated from the rest of the top layer 32, thereby allowing the rest of the top layer to be employed as a ground plate 46.

In one aspect of the present invention, during the stamping or etching process, the positioning of the bond pads 40 may be staggered such that adjacent bond pads are not aligned. For instance, bond pad 40A is disposed on intermediate etch-stop layer 34 along longitudinal axis 48. The adjacent bond pad, bond pad 40B, is disposed on the intermediate etch-stop layer 34 along longitudinal axis 50. The axes, 48 and 50 are separated by a distance D, along an X-axis. Therefore, a center of bond pad 40A is separated from a center of bond pad 40B by a distance substantially equal to distance D along the X-axis. The contact pads 44 may be similarly situated, as for example contact pad 44A and contact pad 44B, which are disposed along different longitudinal axes, not shown in the figures.

In addition, during the formation process of the conductive elements, individual traces 42 may have lengths that are different from adjacent traces or the traces may have the same length. For example, traces 42 positioned adjacent first edge 38 have staggered lengths that alternate from adjacent trace to adjacent trace. For example, trace 42A has a relatively short length while trace 44B has a relatively long length. This configuration enables both bond pad 40A and contact pad 44A to be positioned within a boundary defined by bond pad 40B and contact pad 44B along the X-axis. In other words, both bond pad 40A and contact 44A are positioned between bond pad 40B and contact pad 44B. In contrast, the traces 42 positioned adjacent second edge 39 of metal plate 30 all have similar lengths, as illustrated by traces 42C and 42D. Therefore, when bond pad 40C is offset from bond pad 40D such that the two are not aligned along the same X-axis, bond pad 40D is positioned within a boundary defined by bond pad 40C and 44C along the X-axis. But since trace 42C is the same length as trace 42D, contact pad 44D is not positioned within the boundary defined by bond pad 40C and contact pad 44C. Instead contact pad 44D extends outwardly beyond such a boundary and is positioned closer to the edge 39 of the metal plate when compared to contact pad 44C.

The conductive elements—the bond pads, traces and contact pads—may be formed from any electrically conductive material, but most typically are formed from copper, copper alloys, gold or combinations of these materials. The thickness of these conductive features will vary with the application, but typically is about 5 µm-25 µm.

Figure 3:
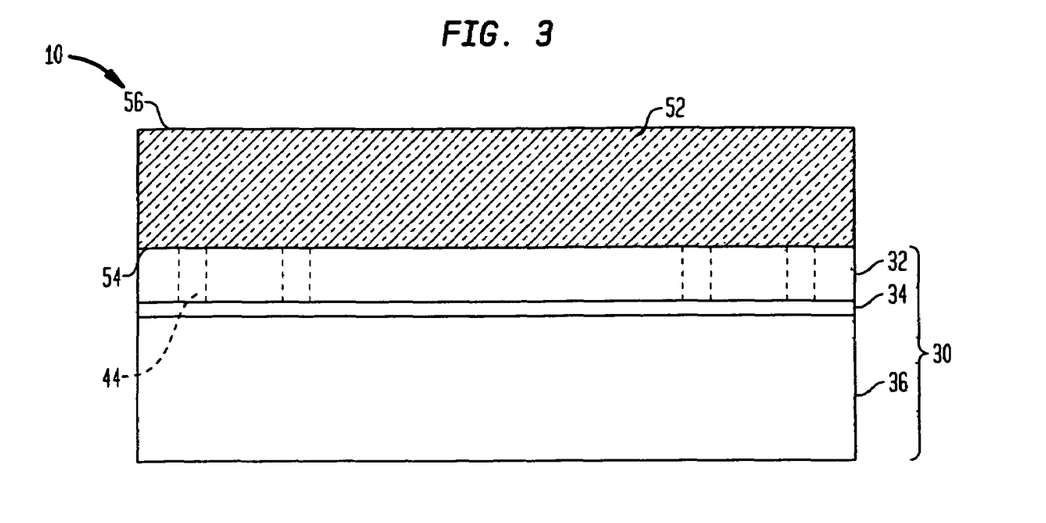
FIG. 3 is a cross-sectional view of the embodiment of FIG. 2 at a later stage of the process.

Referring to FIG. 3, once the top layer 32 of the metallic plate 30 is etched or stamped so as to create the various electrically conductive elements, the top layer 32 is assembled to a flexible dielectric sheet 52 such as a polyimide film. A first face 54 of the dielectric sheet 52 faces toward the top layer 32 and a second face 56 faces away from the top layer 32. Although the thickness of the dielectric sheet 52 also may vary according to the application, the dielectric sheet is preferably about 15-300 µm thick. The dielectric sheet 52 may be comprised of materials such as polyimide, solder mask, or other polymeric material.

Figure 4:
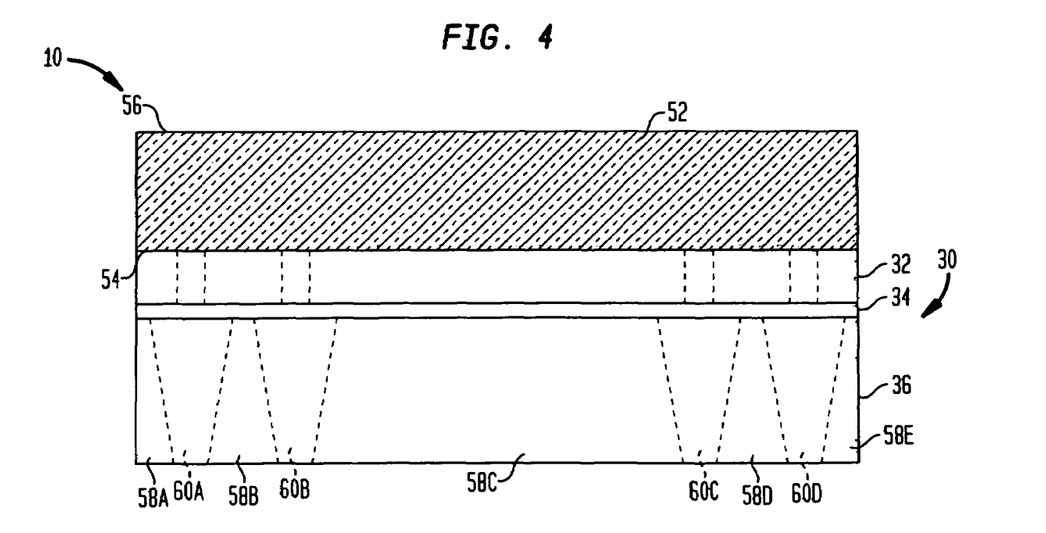
FIG. 4 is a cross-sectional view of the embodiment of FIG. 3 at a later stage of an assembly process.
Figure 5:
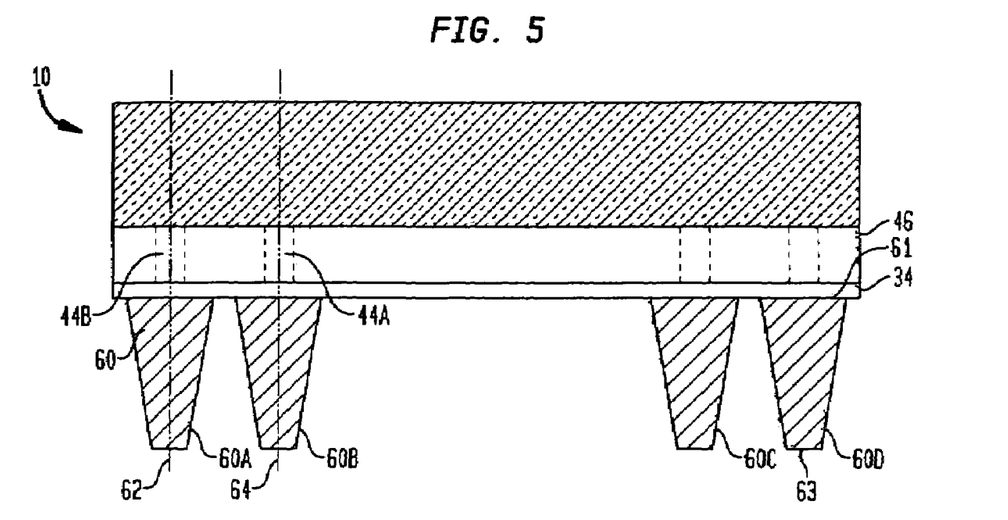
FIGS. 5-9 are cross-sectional views of an embodiment of the present invention during various stages of an assembly process.

Once the dielectric sheet 52 is assembled to the top layer 32, the bottom layer 36 of the metallic plate 30 is stamped or etched to remove portions 58A-58E of the bottom layer 36 (FIG. 4) to form conductive features such as posts 60A-60D, (FIG. 5). As discussed with regard to the top layer 32, the bottom layer 36 is etched or stamped without affecting the intermediate etch-stop layer 34. The posts 60 may be formed using the methods disclosed in commonly assigned U.S. Pat. No. 6,177,636, the disclosure of which is hereby incorporated by reference herein. In one aspect of the present invention, at least some of the posts 60A-60D are aligned with at least some of the contact pads 44, which are shown in hidden view in FIGS. 4 and 5. For instance, post 60A is preferably formed such that a longitudinal axis 62 passing through a center of the post also extends through a center of contact pad 44B, as illustrated in FIG. 5. Thus, the post 60A and conductive pad 44B are aligned and share a common axis and are only separated from one another by the intermediate etch-stop layer 34. Similarly, a longitudinal axis 64 extends through a center of both post 60B and conductive pad 44A such that the post 60B and the conductive pad 44A are aligned with each other and only separated by the intermediate etch-stop layer 34. Not all of the posts 60 may be aligned with contact pads 44 such as post 60D. Instead, post 60D may be aligned with the ground plate 46.

The dimensions of the posts can vary over a significant range, but most typically the height of each post above the surface of the intermediate etch-stop layer 34 is about 50 µm to 300 µm. Each post 60 has a base 61 adjacent the intermediate etch-stop layer 34 and a tip 63 remote from the etch-stop layer. In certain preferred embodiments, the posts 60 are generally frustoconical, so that the base 61 and the tip 63 of each post are substantially circular. The bases 61 of the post 60 typically are about 100-600 µm in diameter, whereas the tips 63 are typically about 40-200 µm in diameter. The posts 60 may be formed from any electrically conductive material, but desirably are formed from metallic materials such as copper, copper alloys, gold and combinations thereof. For example, the posts may be formed principally from copper with a layer of gold at the surface of the posts.

Figure 6:
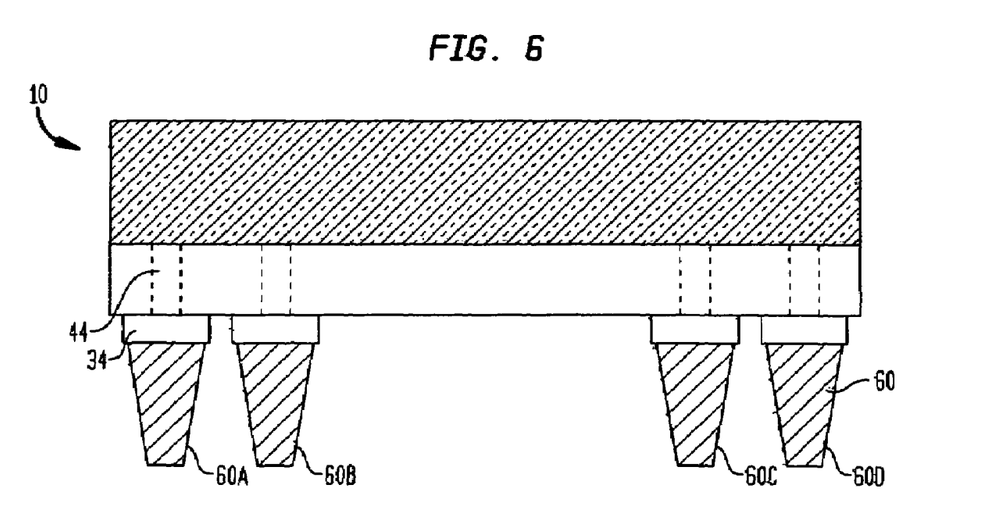

Referring to FIGS. 5 and 6, after the posts 60A-60D have been formed, portions of the intermediate etch-stop layer 34 that are exposed and not covered by the posts are removed by a process that leaves the conductive pads 44, traces 42, (not shown) bond pads 40 (not shown) and posts 60 in place. This process also leaves portions of the etch-stop layer 34 disposed between contact pads 44 and posts 60 in place. At the conclusion of, preferably each contact pad 44 remains electrically connected to at least one post 60 via the portions of the intermediate etch-stop layer 34 that are not removed. Likewise, post 60D remaining in communication with the ground plate 46 via a portion of the etch-stop layer 34.

Figure 7:
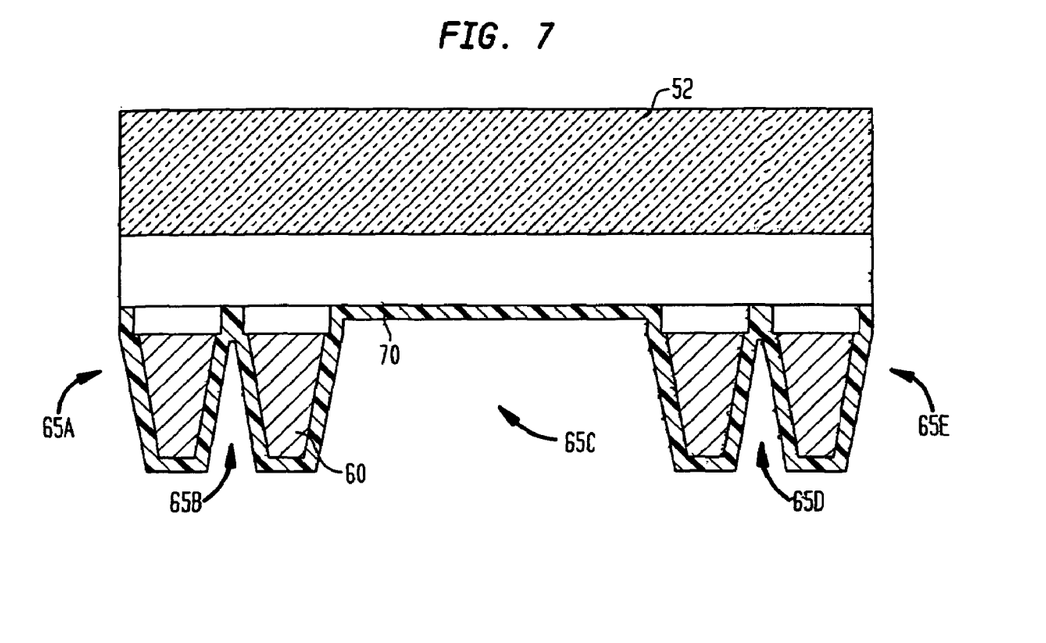

Next, as shown in FIG. 7, a solder mask layer 70 may be placed onto a surface of the bonding pads 40, traces 42 contact pads 44, and ground plate 46 that are exposed and facing in a direction towards the posts 60. The solder mask layer 70 provides rigidity and stability to the structure such that the spatial relationship of the conductive features remains intact. The solder mask layer 70 may be applied by draping a pre-existing layer in a soft, pliable condition over the posts 60 and portions of the top layer 32 that are exposed and facing towards the posts 60, such as in regions 65A-65E. The solder mask layer 70 may then be forced into conformity with the posts 60 and regions 65A-65E between the posts. For example, a fluid such as air under pressure may be applied to the surface of the solder mask layer 70 facing away from the dielectric sheet 52. The portions of the solder mask layer 70 aligned with the posts 60 are stretched and thinned during this process. In some cases, the minimum thickness will occur along the sides of the posts 60. In another variant, the dielectric layer is formed by applying a solder mask or a dielectric in liquid form and curing the layer. This also tends to form a solder mask layer that has thin portions on the posts 60.

Figure 8:
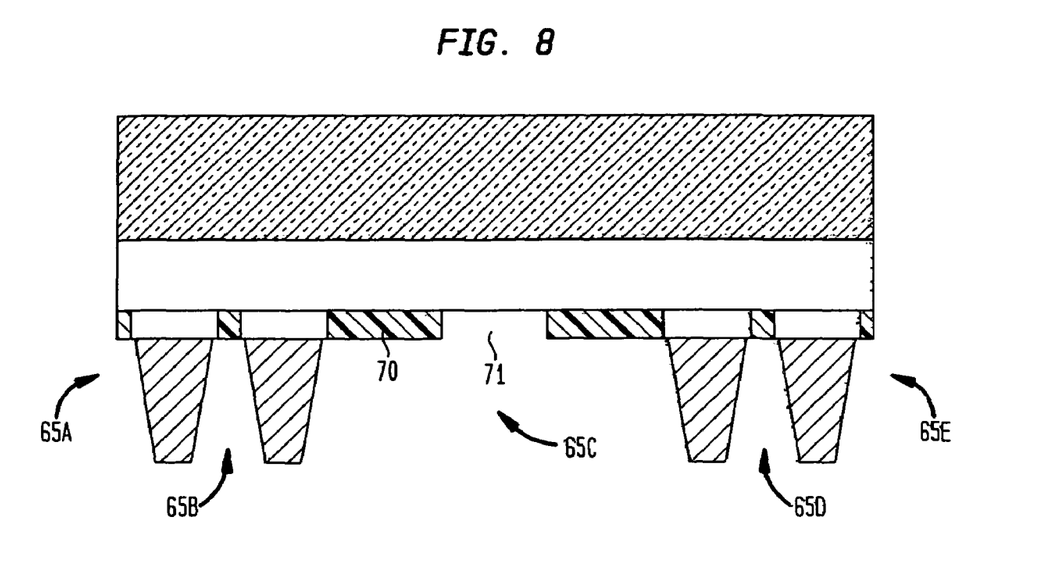

The solder mask layer 70 is then subjected to a process by which substantially all of the solder mask layer is removed from the posts 60, while a sufficient amount of the solder mask layer 70 remains fixed on the exposed sides of the bond pads 40 (not shown), traces 42 (not shown), contact pads 44 and ground plate 46, as well as the portions of the first surface 54 of the dielectric element 52 that are exposed through the grooves 33 (not shown) of the top layer 32. Such a process can include etching using a plasma, washing with a solvent that attacks the solder mask layer 70 or other processes. Preferably, the process of removing the solder mask layer 70 from the posts 60 includes a non-selective process. A non-selective process inherently includes removing a portion of the solder mask layer 70 from sections 65A-65E. As used in this disclosure with reference to a process applied to a layer or surface, a "non-selective process" is one that is applied indiscriminately to all portions of the layer or surface. Where a non-selective process is applied to a layer of uniform composition and uniform physical state, such a process typically removes substantially the same amount of the solder mask layer 70 per unit time from both the regions 65A-65E and the posts 60. Because the thickness of the solder mask layer 70 deposited on the regions 65A-65E is greater than that which is deposited on the posts 60, the entire portion of the solder mask layer 70 deposited on the posts 60 can be removed, while leaving an appropriate amount of the solder mask layer 70 in the regions 65A-65E (FIG. 8).

Alternatively or additionally, the process of removing the solder mask layer 70 from the posts 60 may include a selective process. A "selective process" is one that is only carried out on specific portions of the solder mask layer 70. For example, those portions of the solder mask layer in regions 65A-65E may be masked prior to etching, so that the etching is applied only to those portions of the solder mask layer 70 that are disposed on the posts 60.

More preferably, the solder mask layer 70 is made of a photo-imageable material such as a photo-imageable polyimide. In one embodiment, such a photo-imageable material may be of the type that is cured by selective exposure to light. This allows the solder mask layer 70 to be deposited in the regions 65A-65E and on the posts 60 in an uncured state. An "uncured state" is one in which the solder mask layer 70 is either liquid or is otherwise unfixed on the surface to which it is applied. The solder mask layer 70 is then selectively exposed to light in the areas where the solder mask layer 70 is deposited, but not in areas where the solder mask layer 70 is disposed on the posts 60. Thus, the material in the regions 65A-65E is cured to a greater extent than the material on the posts 60. The subassembly is then subjected to a non-selective process, such as washing, by which the uncured portion of the solder mask layer 70 can be removed while leaving the cured portions of the solder mask layer fixed in regions 65A-65E.

Although the thickness of the solder mask layer 70 will vary with the application, the solder mask layer, after removal of the material on the posts 60, most typically is about 5 μm to 50 μm thick in the regions between the posts. During the removal process, a portion of the solder mask layer 70 may also be removed such that a recess 71 is created in region 65C. The recess 71 is preferably situated such that a surface of the ground plate 46 remote from the dielectric sheet 52 is exposed. Thus with reference to FIG. 8, it can be seen that the solder mask layer 70 has been removed from the posts 60 and in region 65C where the recess 71 is created.

Figure 9:
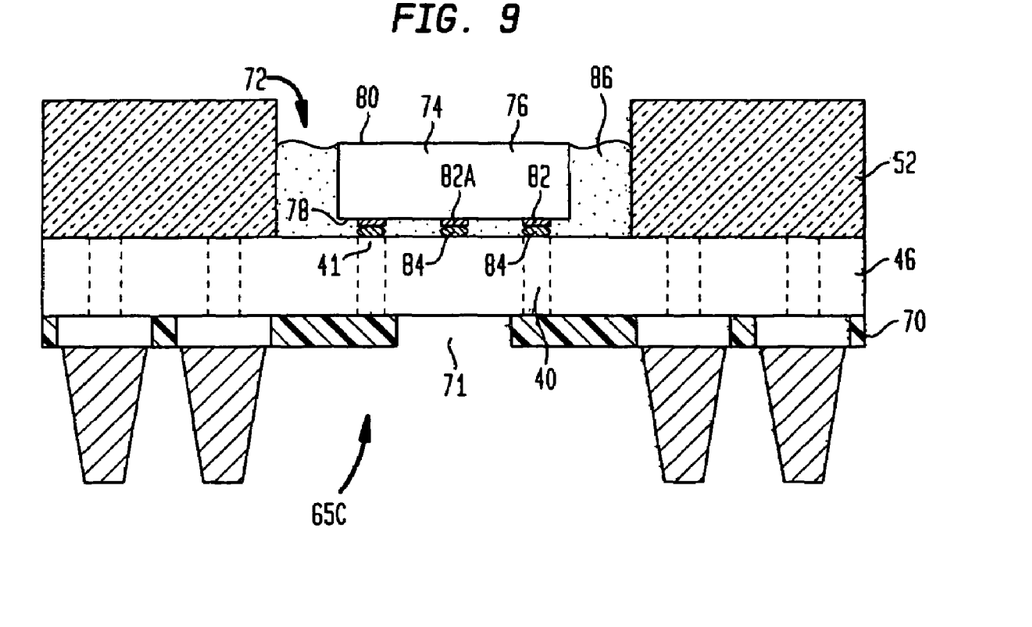

With reference to FIG. 9, either before or after the solder mask layer 70 is attached to the regions 65A-65E, a cavity 72 may be created within the dielectric sheet 52. The cavity 72 may be created by physically or chemically etching away the unwanted portion of the dielectric sheet 52. The cavity 72 is preferably located adjacent the bond pads 40 (shown in hidden lines) such that a first surface 41 of the bond pads facing away from the solder mask layer 70 is exposed. With portions of the dielectric sheet 52 removed, the solder mask layer 70 provides the structural integrity for the subassembly, as alluded to previously, as well as the ground plate 46.

A microelectronic element 74 is then placed within cavity 72, as shown in FIG. 9. The microelectronic element 74 may include a microelectronic package or a bare chip 76. The bare chip 76 preferably includes a plurality of contacts 82 exposed at a front face 78 of the chip. The chip 76 also includes an oppositely-facing rear face 80 that is remote from the contacts 82. In a method of assembly, the front face 78 of the chip 76 faces the bond pads 40 and traces 44 and the rear face 80 of the chip 76 faces away from the bond pads 40 and traces 42. As the chip 76 is brought proximate to the bond pads 40, the contacts 82 of the chip are positioned adjacent the bond pads 40. An electrically conductive material such as solder 84 may be positioned between adjacent contacts 82 and bond pads 40 such that at least some of the bond pads 40 are in electrical communication with at least some of the contacts 82. In addition, the chip 76 may be provided with a ground contact 82A, which can be connected to ground plate 46 using solder 84 also. This enables the chip 76 to be grounded to the ground plate 46 and subsequently to an additional element if required.

An encapsulant material 86 may be introduced in and around the chip 76. Preferably, at least some of the encapsulant material 86 is disposed between the front face 78 of the chip 76 and the solder mask layer 70 disposed in region 65C. The encapsulant material 86 is urged into grooves 33 (not shown) such that it contacts the solder mask layer 70 as well as enters into recess 71. Once the encapsulant material 86 is dispersed around the chip 76, the encapsulant material is cured.

Figure 10:
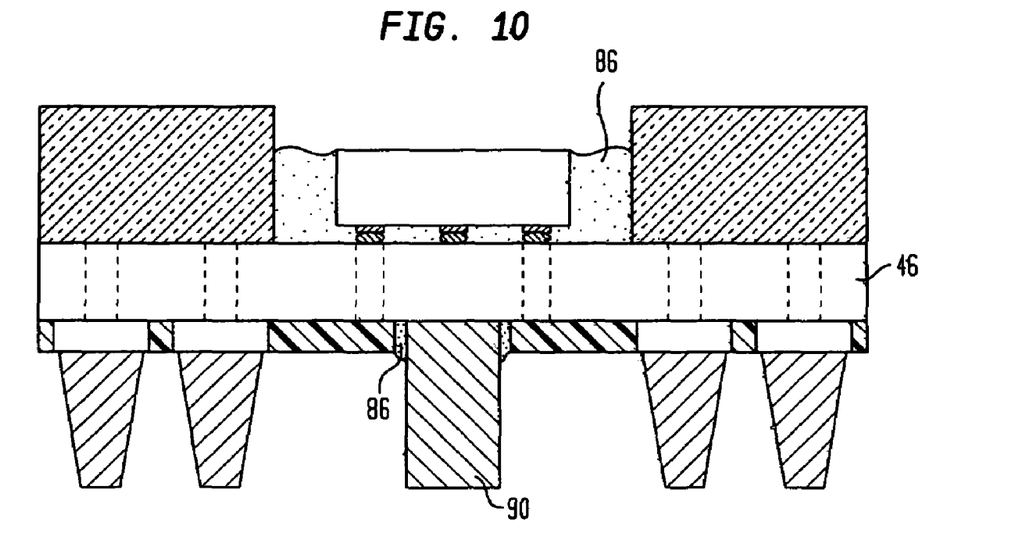
FIG. 10 is a cross-sectional view of an embodiment according to the present invention.

A heat spreader 90 may next be added to the microelectronic package 10, as shown in FIG. 10. The heat spreader 90 is disposed within recess 71 and attached to the ground plate 46. The heat spreader 90 is thermally conductive and adapted for removing heat from the chip 76. The heat spreader 90 is able to remove heat from the chip 76 through the ground plate 46. In addition, the heat spreader may also being thermally connected to the chip 76 via the encapsulant material 86, which may be already dispersed in and around chip 76, and preferably dispersed within recess 71. Thus the encapsulant material may also be placed in contact with the heat spreader 90. The encapsulant material 86 is able to contact the heat spreader 90 if some of the encapsulant material was urged through grooves 33 while it was being applied. Preferably, the encapsulant material 86 is a thermally conductive material that is able to transfer heat from the chip 76 to the heat spreader 90. The heat spreader 90 may be a thermally conductive material such as solder or the like.

Figure 11:
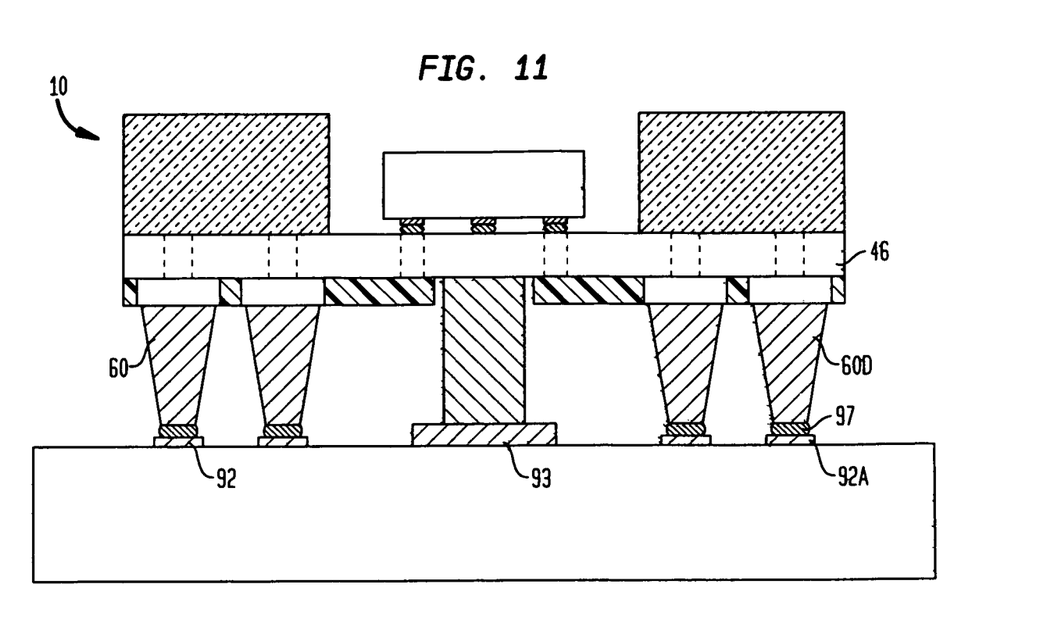
FIG. 11 is a cross-sectional view of an assembly according to one embodiment of the present invention.

The microelectronic package 10 may be attached to a second microelectronic element such as circuit panel 91, shown in FIG. 11. The circuit panel 91 includes contacts 92 and a thermally conductive pad 93. During the assembly process, the microelectronic package 10 is brought proximate the circuit panel 91 and the posts 60 of the package 10 are positioned adjacent the conductive pads 92 of the circuit panel 91. The posts 60 are engaged with the contacts 92 of the circuit panel 91 for electrically interconnecting the package 10 to the circuit panel. In addition, the heat spreader 90 is preferably placed in thermal communication with the thermal conductive pad 93 on the circuit panel 91. The posts 60 may be bonded to the contacts 92 using solder 97 or a similar material.

Additionally, the circuit panel 91 may be provided with a ground contact 92A. In such a situation, post 60D which is attached to the ground plate 46 may be attached to ground contact 92A such that the microelectronic package 10 may be grounded to the circuit panel.

Figure 12:
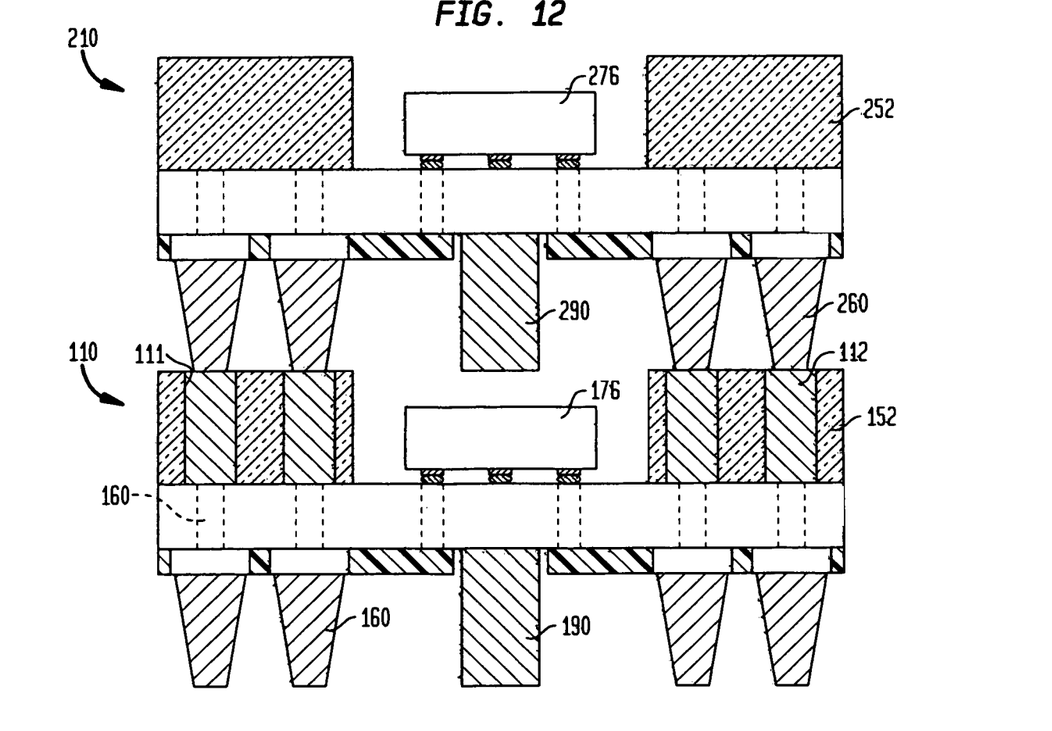
FIG. 12 is a cross-sectional view of an embodiment according to the present invention.

In another aspect of the present invention, a plurality of microelectronic packages 110, and 210 may be stacked one atop another, as shown in FIG. 12. Microelectronic packages 110 and 210 are similar to microelectronic package 10 and thus similar reference characters will be used to describe similar features. For instance, microelectronic package 110 includes posts 160, dielectric sheet 152, bare chip 176 and heat spreader 190 as well as other features discussed with regard to microelectronic package 10. Similarly, microelectronic package 210 includes posts 260, dielectric sheet 252, bare chip 276 and heat spreader 290 as well as other features discussed with regard to microelectronic package 10. In order to stack the microelectronic packages 110, and 210, holes 111 are created in dielectric sheet 152 of microelectronic package 110. Preferably the holes 111 are aligned with the posts 160. Next, microelectronic package 210 is brought proximate with microelectronic package 110 such that posts 260 are aligned with holes 111. Once aligned, the post 260 of the microelectronic package 210 may be electrically connected to the posts 160 of the microelectronic package 110 by placing an electrically conductive material such as solder 112 within holes 111 and bringing the post 260 into contact with the solder 112. The solder 112 may be placed within the holes 111 prior to the posts 260 being aligned with the holes 111.

Thus, as posts 260 are placed in holes 111 or adjacent to the holes, the post 260 contact the solder 112. The solder 112 also in communication with contact pads 144 exposed in holes 111, therefore electrically connects the posts 260 to the contact pads 144 and further to posts 160. This electrically connects the post 260 with contact pads 144 as well as posts 160.

One difference between microelectronic package 110 and microelectronic package 10 may be that not all the posts 160 are attached to contact pads or the ground plate. Thus some of the posts 160 may be specifically constructed to act as intermediate devices connecting posts 260 to contact pads of a circuit panel.

Figure 13:
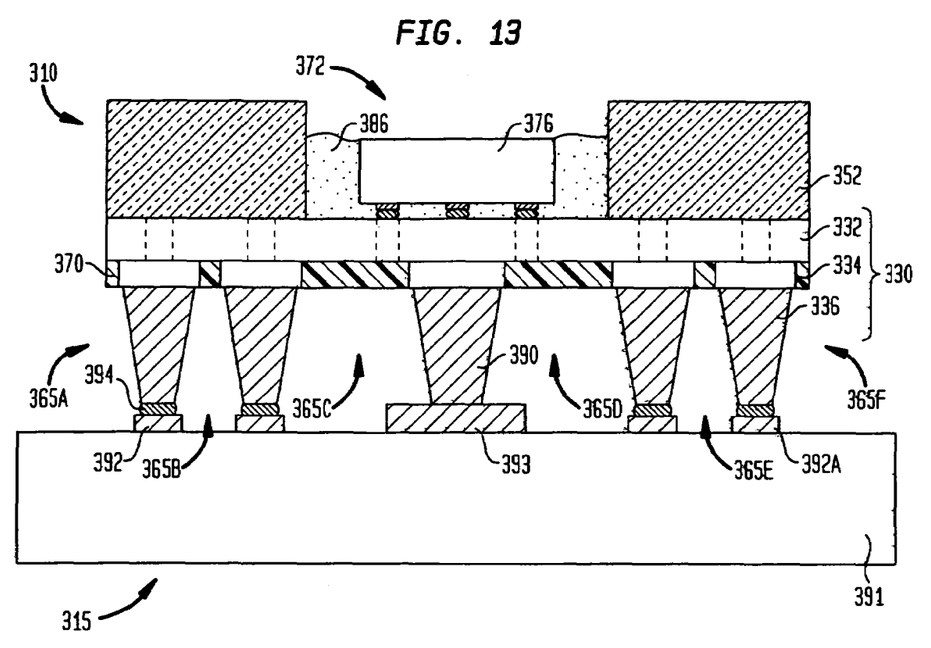
FIG. 13 is a cross-sectional view of an assembly according to one embodiment of the present invention.

In another aspect of the present invention, the heat spreader may be formed in conjunction with the posts. For instance, as shown in FIG. 13, microelectronic package 310 is formed beginning with a three-layer metallic plate 330 as before. After a top layer 332 of the plate 330 is etched or stamped to form the various conductive elements, as discussed with regard to microelectronic package 10 and the dielectric sheet 352 is attached to the top layer 332, as before, the posts 360 are formed by etching or stamping the bottom layer 336 of the metal plate 330. However, while etching or stamping the bottom layer 336 of the metal plate 330 to form the posts 360, the heat spreader 390 is also created. Thus, the heat spreader 390 is formed from the material comprising the bottom layer 336. The heat spreader 390 is preferably isolated from the conductive elements of the top layer 332 not including the ground. As before, portions of the intermediate etch-stop layer 334 (not shown) may be removed. And a solder mask layer 370 may be applied to regions 365A-365E as discussed with regard to microelectronic package 10. The solder mask layer 370 may be "selectively" or "non-selectively" positioned with the solder mask layer 370 being applied to the posts 360 and heat spreader 390 at first and then removed.

Next, a cavity 372 is created within the dielectric sheet 352. Preferably, the cavity 372 is created such that portions of the conductive elements, bond pads 340 and traces 342 as well as ground plate 346 of the top layer 332 are exposed. Additionally, the cavity 372 is situated such that the heat spreader 390 is positioned adjacent the cavity. A microelectronic element such as chip 376 is placed within the cavity 372 and electrically connected to the conductive elements as discussed previously. A thermally conductive encapsulant material 386 is placed in and around the chip 376. The encapsulant material 386 is preferably in contact with both the chip 376 and heat spreader 390 such that the encapsulant material can transfer heat from the chip to the heat spreader.

Once the microelectronic package 310 is completed, the package may be attached to a second microelectronic element such as a circuit panel 391. As with the previous embodiments, the circuit panel 391 preferably includes contact pads 392 a thermal pad 393, and a ground contact 392A. The posts 360 are attached to the contact pads 392 and ground contact 392A using an electrically conductive material such as solder 394 and the heat spreader 390 is attached to the thermal pad 393 to form a microelectronic assembly 315.

Figure 14:
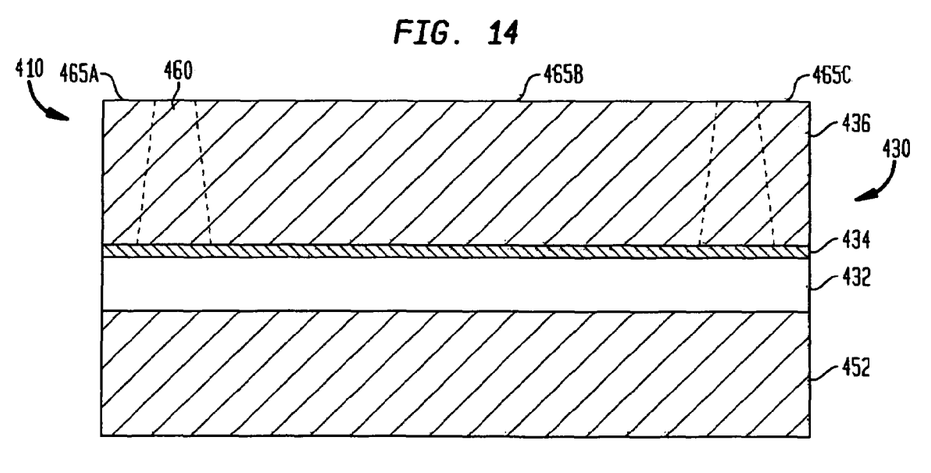
FIGS. 14-16 are cross-sectional views of one embodiment of the present invention during various stages of an assembly process.

In another aspect of the present invention, the microelectronic element or chip may be positioned on the same side of the metal plate as the posts. Thus, to form microelectronic package 410, a metallic plate 430 is provided having a top layer 432, an intermediate etch-stop layer 434 and a bottom layer 436. The top layer 432 is etched or stamped to form bond pads, traces, contact pads and a ground plate, not shown in FIG. 14, but shown in FIG. 2 with reference to microelectronic element 10. A dielectric sheet 452 is then attached to a surface of the top layer 432 that is remote from the intermediate etch-stop layer. FIG. 14 and subsequent figures depict the unit in reverse orientation with bottom layer 436 at the top of the drawing.

Figure 15:
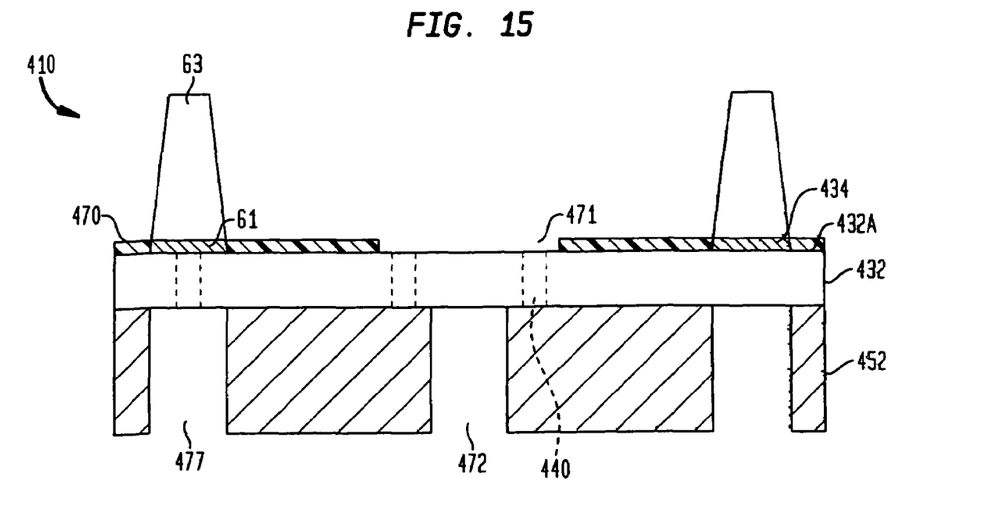

The bottom layer 436 is then either etched or stamped to form posts 460. For instance, regions 465A-465C of the bottom layer 436 may be removed such that posts 460 remain. As discussed in conjunction with previous embodiments, at least some of the posts 460 are preferably aligned with contact pads 444 of the top layer 432, shown in hidden lines in FIG. 15. Also as shown in FIG. 15, after portions of the intermediate etch-stop layer 434 are removed, a solder mask layer 470 may be applied to a first surface 432A of the top layer 432 that is remote from the dielectric sheet 452. The solder mask layer 470 be simply be positioned such that it is not on the tips 463 of the posts 460 or the solder mask layer may be placed on the entire surface of the microelectronic element 410 and then removed as discussed with regard to microelectronic element 10. Preferably, the solder mask layer 470 is also not positioned on or is removed from a portion of the first surface 432A of the top layer 432 such that a cavity 471 is created. Preferably, the cavity 471 is aligned with the bond pads 440 (shown in hidden lines) such that a surface of the bond pads facing the posts 460 is exposed.

Next, holes 477 and recess 472 are created in the dielectric sheet 452. The holes 477 are preferably aligned with the contact pads 444 and the posts 460, as shown in FIG. 15. This enables the contact pads 444 and the base 461 of the posts 460 or at least the portion of the intermediate etch-stop layer 434 that is adjacent to the base of the posts, to be exposed through the dielectric sheet 452.

Figure 16:
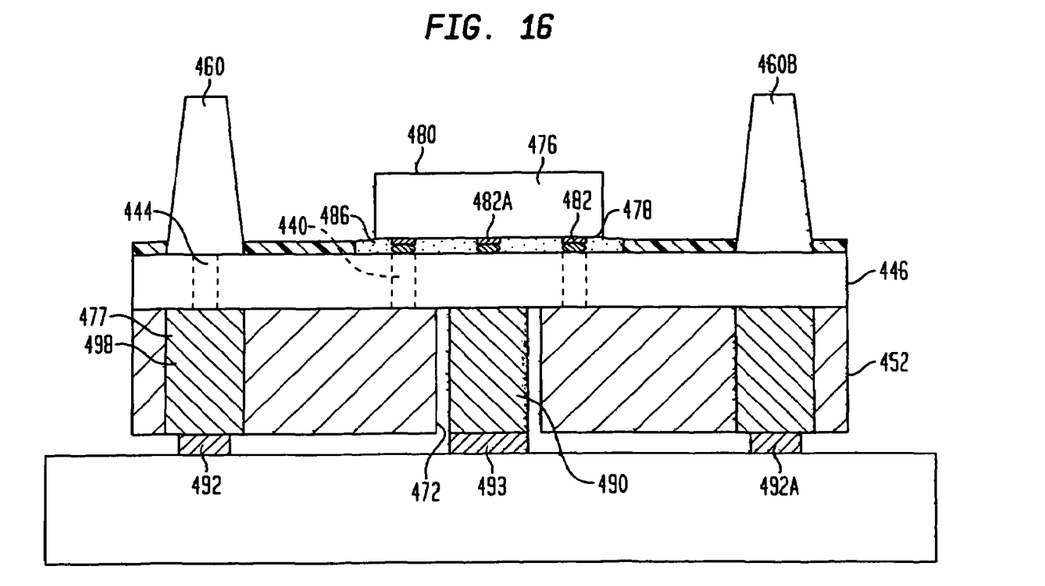

Referring to FIG. 16, a microelectronic element such as bare chip 476 may be positioned within or in alignment with cavity 471. The chip 476 includes a first side 478 and an oppositely-facing second side 480. A plurality of contacts 482 are exposed at the first side 478 of the chip as well as preferably at least one ground contact 482A. While placing the chip 476 in the cavity 471, at least some of the contacts 482 are positioned adjacent the bond pads 440. The contacts 482 are electrically connected to the bond pads 440 using an electrically conductive material such as solder 484. And, the ground contact 482A may be connected to the ground plate 446 also using solder 486 or the like. A heat spreader 490, comprised of thermally conductive material is positioned within recess 472 and thermally connected to bare chip 476 by thermally conductive material 486 and ground plate 446. The thermally conductive material 486 may be an encapsulant material that is disposed around chip 476 and in cavity 471. The thermally conductive material 486 may be urged through grooves (not shown) in the top layer 432. Thus, the thermally conductive material 486 can transfer heat from the chip 476 to the heat spreader 490.

Once assembled, the microelectronic package 410 may be attached to a second microelectronic element such as circuit panel 491. The circuit panel 491 preferably includes contacts 492, which are electrically connected to the posts 460 of the microelectronic package 410. The contacts 492 are connected to the post 460 by positioning the dielectric sheet 452 adjacent the circuit panel 491 and aligning the holes 477 to the contacts 492. An electrically conductive material such as solder 498 is disposed within the holes 477 and electrically connects the posts 460 to the contacts 492 through the contact pads 444 also exposed in the holes. Further, ground contact 492A may be electrically connected to ground plate 446 also by disposing solder in a hole 477 such that the solder electrically connects the ground plate 446 to the contact 492A. In such a situation, post 460B may not be attached to a contact pad but rather the ground plate 446 or the post 460B may be removed entirely. As the contacts 492 of the circuit panel are being aligned and connected to the posts 460, the heat spreader 490 is aligned and thermally attached to a thermal pad 493. The thermal pad 493 is disposed on the circuit panel 491.

Figure 17:
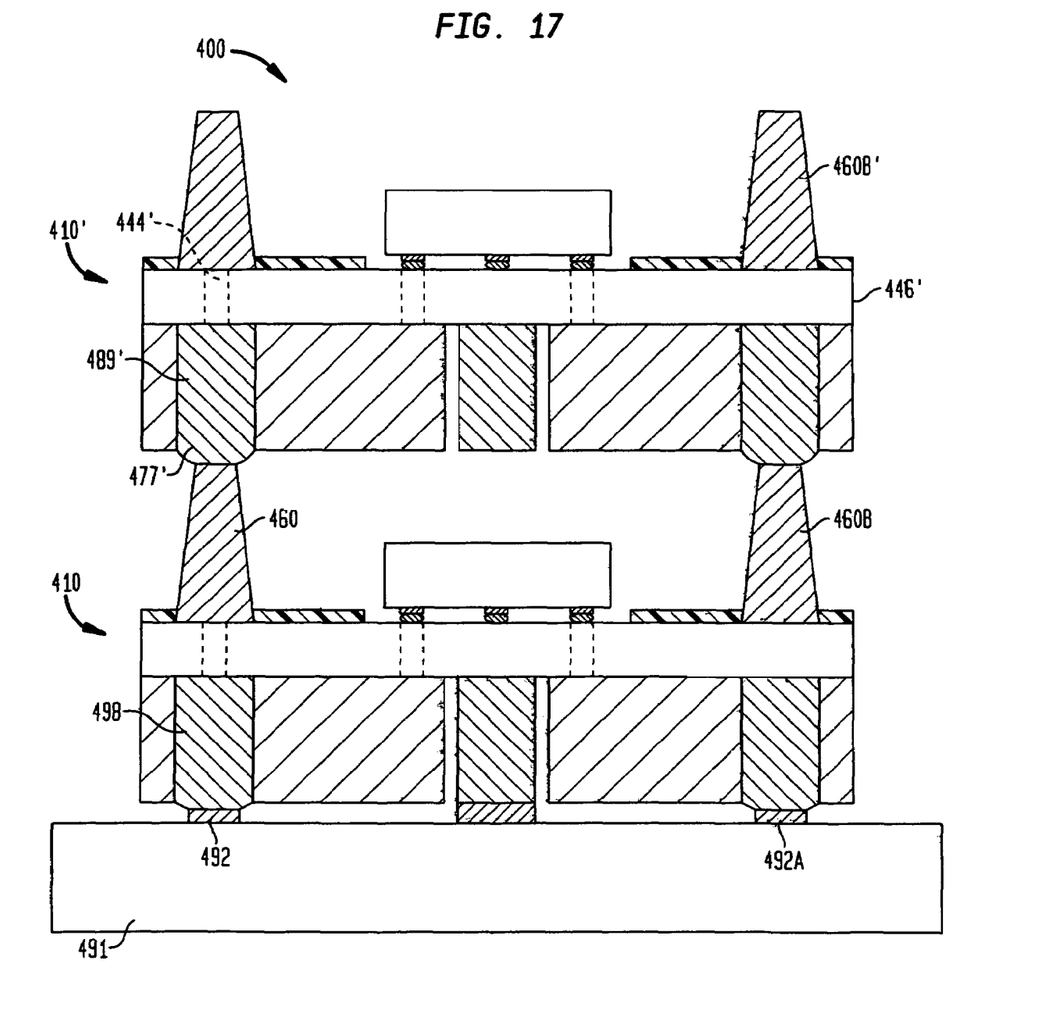
FIG. 17 is a cross-sectional view of one embodiment according to the present invention.

In another aspect of the present invention, the microelectronic package 410 may be stacked to another microelectronic package 410' (FIG. 17), which is substantially the same as package 410 to form a microelectronic assembly 400. Therefore, specific features of microelectronic package 410' will be given similar reference characters as microelectronic package 410 with the only difference being a ' after the reference character. For example, referring to FIG. 17, the microelectronic package 410 is positioned directly below the microelectronic package 410'. And the holes 477' of the package 410' are aligned with the posts 460 of the package 410. Once the holes 477' and posts 460 are proximate one another solder 489 may be placed within holes 477' to electrically connect the contact pads 444' of the package 410' to the posts 460 of package 410. Although only two stacked packages are illustrated, the assembly may include a plurality of packages. Microelectronic package 410 may be connected to circuit panel 491 as before. Thus, post 460' and contact 444' via solder 489', post 460', contact pad 444 and solder 498 may be in communication with contact 492. As with post 460B, post 460B' may be connected to ground plate 446'. And the post 460B' may be electrically connected to post 460 via solder or the like. This enables the ground plate 446' to be in communication with ground contact 492A of circuit panel 491.

Figure 18:
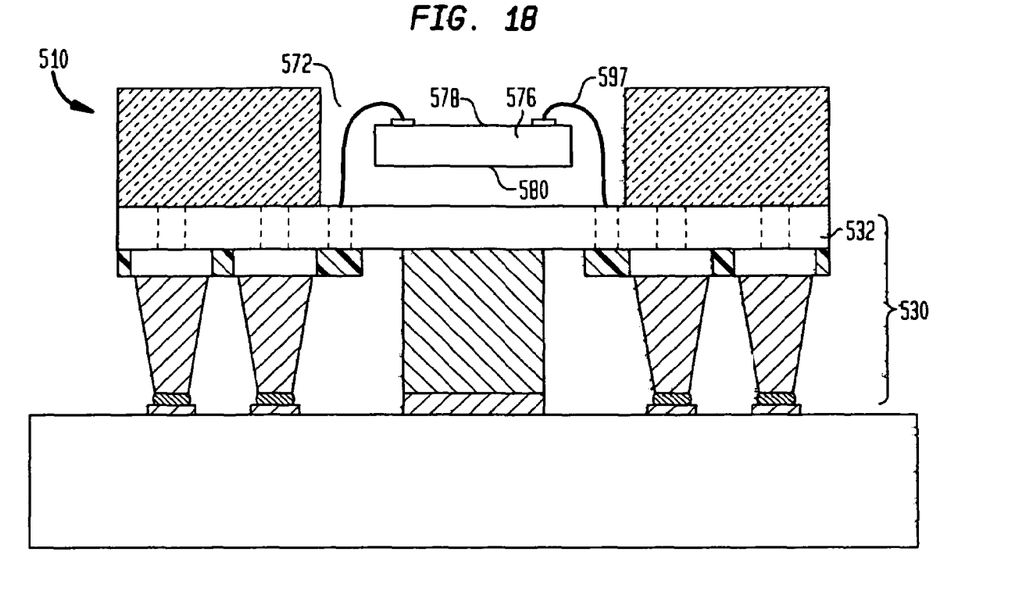
FIGS. 18 and 19 are cross-sectional views of one embodiment of the present invention.

In one aspect of the present invention, the embodiments discussed herein may incorporate wire bonds as opposed to "flip chips." For instance, referring to FIG. 18, microelectronic package 510 is similar to microelectronic package 10 of FIGS. 1-10 except that microelectronic package 510 includes a chip 576 that has contacts 582 facing away from bond pads 540. The chip 576 includes a first side 578 and a second side 580. A plurality of contacts 582 are exposed at the first side 578 of the chip 576. When the chip is placed within cavity 572, the second side 580 of the chip is adjacent the ground plate formed from top layer 532 of the metal plate 530. Wire bonds 597 are used to electrically connect the contacts 582 to the bond pads 540. The second or reverse surface 580 of the chip can be bonded to the ground plate by a thermally conductive encapsulant or by a solder (not shown), to provide good heat transfer from the chip to the ground plate and hence to the heat spreader 590.

Figure 19:
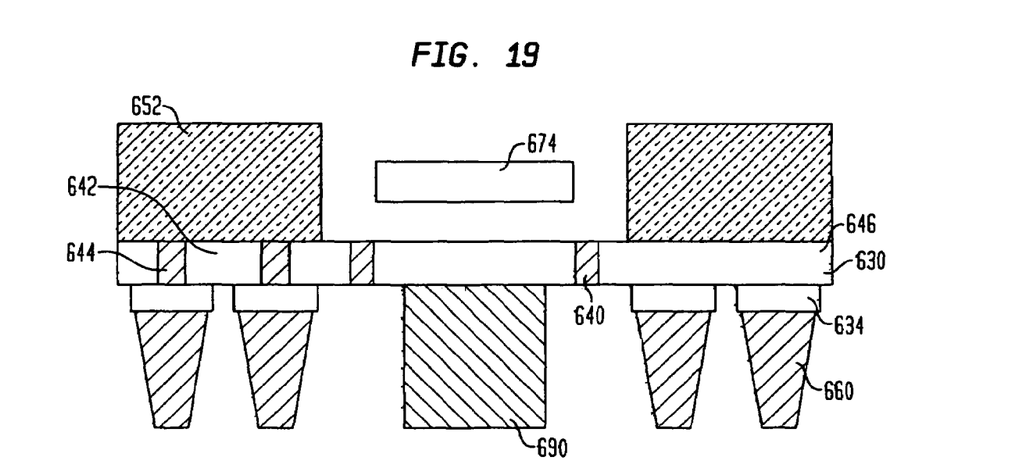

In another aspect of the present invention the conductive posts may be formed from a non-integral metal as compared to the other conductive features. Thus, a metal plate 630 may be etched or stamped to form a plurality of bond pads 640, traces 642 and contact pads 644 as well as ground plate 646 on an upper surface of a top layer 632. The metal plate 630 may include a bottom layer 634 that serves as a stop layer. Conductive posts 660, formed separately, may then be attached to the bottom layer 634 of the metal plate 630 according to methods known by those in the art.

After a dielectric sheet 652 is adhered to the upper surface of the top layer 632, the microelectronic package may be constructed similar to embodiments discussed herein including the addition of a heat spreader 690 and a chip 674. The heat spreader 690 may be a separate element or formed in conjunction with the conductive posts 660 and attached at the same time as the posts.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a microelectronic package comprising the steps of:
    a) providing a three-layer metal plate having a first layer, a second layer and a third layer;
    b) forming a plurality of conductive elements from said first layer of said metal plate;
    c) attaching a dielectric sheet to said first layer, said dielectric sheet being remote from said third layer;
    d) forming a plurality of conductive features from said third layer of said metal plate, said conductive features being remote from said dielectric sheet;
    e) electrically connecting a microelectronic element to said conductive elements; and
    f) thermally connecting a heat spreader to said microelectronic element.

2. The method of claim 1, wherein the step of forming said plurality of conductive elements includes forming traces, and wherein said traces are electrically connected to said microelectronic element and said conductive features formed from said third layer.

3. The method of claim 1, wherein the step of forming said plurality of conductive elements from said first layer includes forming traces and a ground plate, said traces being electrically isolated from said ground plate.

4. The method of claim 2, wherein said conductive elements include bond pads and contact pads, said bond pads being disposed at first ends of said traces and said contact pads being disposed at second ends of said traces, such that said traces, bond pads and contact pads are in electrical communication with one another.

5. The method of claim 4, wherein said conductive features formed from said third layer includes posts, at least some of said posts being in electrical communication with at least some of said contact pads formed from said first layer.

6. The method of claim 5, wherein at least one of said posts formed from said third layer is attached to said ground plate.

7. The method of claim 6, wherein a thermally conductive material is disposed on said microelectronic element such that said microelectronic element and said heat spreader are thermally connected at least in part by said thermally conductive material.

8. A method for forming a microelectronic assembly comprising the method of claim 1, further comprising providing a circuit panel having contacts and a thermal pad, electrically connecting at least some of said conductive features of said third layer with said contacts of said circuit panel, thermally connecting said heat spreader with said thermal pad of said circuit panel.

9. The method of claim 1, wherein said heat spreader is formed from said third layer of said metal plate.

10. The method of claim 1, wherein said heat spreader is comprised of a solder.

11. The method of claim 1, further comprising removing a portion of said dielectric sheet to form a cavity, wherein a first surface of at least some of said conductive elements is exposed in said cavity, wherein the step of connecting said microelectronic element to said conductive elements includes disposing said microelectronic element in said cavity and electrically connecting said microelectronic element to said first surfaces of said conductive elements exposed in said cavity.

* * * * *